United States Patent
Hauer

(10) Patent No.: US 11,881,701 B2
(45) Date of Patent: Jan. 23, 2024

(54) DC-OVERCURRENT DETECTOR

(71) Applicant: Eaton Intelligent Power Limited, Dublin (IE)

(72) Inventor: Wolfgang Hauer, Vorderweissenbach (AT)

(73) Assignee: EATON INTELLIGENT POWER LIMITED, Dublin (IE)

( * ) Notice: Subject to any disclaimer, the term of this patent is extended or adjusted under 35 U.S.C. 154(b) by 228 days.

(21) Appl. No.: 17/338,714

(22) Filed: Jun. 4, 2021

(65) Prior Publication Data
US 2021/0384717 A1   Dec. 9, 2021

(30) Foreign Application Priority Data

Jun. 8, 2020 (GB) ..................................... 2008583

(51) Int. Cl.
| | | |
|---|---|---|
| *H02P 1/12* | (2006.01) | |
| *H02M 1/12* | (2006.01) | |
| *H02H 1/00* | (2006.01) | |
| *G01R 19/165* | (2006.01) | |
| *H02H 3/087* | (2006.01) | |

(52) U.S. Cl.
CPC ..... *H02H 1/0007* (2013.01); *G01R 19/16571* (2013.01); *H02H 3/087* (2013.01)

(58) Field of Classification Search
CPC ............. H02M 1/38; H02M 1/44; H02M 1/32
See application file for complete search history.

(56) References Cited

U.S. PATENT DOCUMENTS

| | | | |
|---|---|---|---|
| 2011/0141644 A1* | 6/2011 | Hastings | H01L 31/02021 361/93.2 |
| 2014/0077782 A1* | 3/2014 | Cortigiani | H02M 3/156 323/284 |
| 2015/0160268 A1* | 6/2015 | Juds | G01R 15/202 324/251 |
| 2015/0294825 A1 | 10/2015 | Zhou et al. | |
| 2017/0170772 A1* | 6/2017 | VanEyll | H02P 29/0241 |
| 2020/0366079 A1* | 11/2020 | Telefus | H02H 3/20 |

FOREIGN PATENT DOCUMENTS

EP    0579462 A2    1/1994

* cited by examiner

*Primary Examiner* — Kawing Chan
*Assistant Examiner* — Charles S Laughlin
(74) *Attorney, Agent, or Firm* — LEYDIG, VOIT & MAYER, LTD.

(57) ABSTRACT

A DC-overcurrent detector includes: at least one electric line passing the detector from a source terminal of the detector to a load terminal of the detector; at least one first sensor for monitoring an electric current in the at least one electric line and outputting a current measurement signal; at least one current flow direction sensor for distinguishing a current flow direction of the electric current in the at least one electric line between a first direction from the source terminal to the load terminal and a second direction from the load terminal to the source terminal, and outputting a current flow direction signal; a comparator unit for comparing an actual value of the current measurement signal with a threshold criterion, and outputting a trigger signal at a trigger output if a value of the current measurement signal reaches the threshold criterion; and a threshold criterion unit.

17 Claims, 1 Drawing Sheet

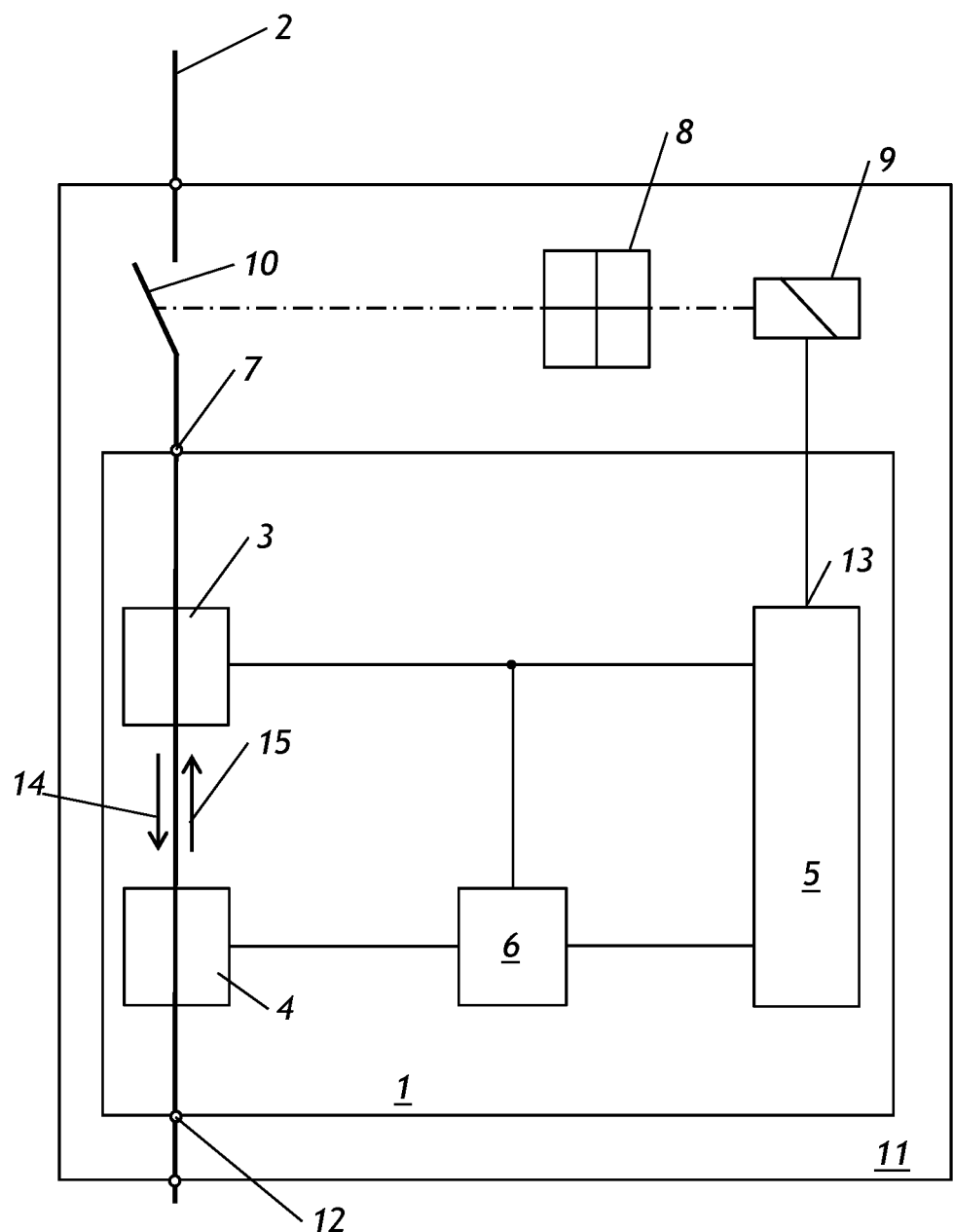

DC-OVERCURRENT DETECTOR

CROSS-REFERENCE TO PRIOR APPLICATION

Priority is claimed to British Patent Application No. GB 2008583.3, filed on Jun. 8, 2020, the entire disclosure of which is hereby incorporated by reference herein.

FIELD

The present disclosure relates to a DC-Overcurrent detector.

BACKGROUND

Modern electric DC grids comprise a plurality of electric loads as well as distributed generators. A lot of loads may comprise capacitors or inverters and store energy. Energy may flow in different directions in modern grids. Especially if a fault occurs in a sub segment of a DC grid all other segments will fed current to the fault location. These currents flow in parts of the grid in the so called reverse direction. These currents may be high enough to cause an unwanted tripping of a circuit breaker.

SUMMARY

In an embodiment, the present invention provides a DC-overcurrent detector, comprising: at least one electric line passing the detector from a source terminal of the detector to a load terminal of the detector; at least one first sensor configured to monitor an electric current in the at least one electric line and output a current measurement signal; at least one current flow direction sensor configured to distinguish a current flow direction of the electric current in the at least one electric line between a first direction from the source terminal to the load terminal and a second direction from the load terminal to the source terminal, and output a current flow direction signal; a comparator unit configured to compare an actual value of the current measurement signal with a threshold criterion, and to output a trigger signal at a trigger output if a value of the current measurement signal reaches the threshold criterion; and a threshold criterion unit, an input of the threshold criterion unit being connected to the at least one current flow direction sensor, and an output of the threshold criterion unit being connected to the comparator unit, providing the comparator unit with the threshold criterion, wherein the threshold criterion unit is configured to determine a first threshold criterion if the actual current flows in the first direction, and a second threshold criterion if the actual current flows in the second direction.

BRIEF DESCRIPTION OF THE DRAWINGS

The present invention will be described in even greater detail below based on the exemplary figures. The invention is not limited to the exemplary embodiments. Other features and advantages of various embodiments of the present invention will become apparent by reading the following detailed description with reference to the attached drawings which illustrate the following:

The single FIG. shows a block diagram of a first preferred embodiment of an overcurrent detector according to the invention as part of an overcurrent protection switch.

DETAILED DESCRIPTION

In an embodiment, the present invention overcomes the drawbacks of the state of the art by providing an overcurrent detector which has a low tendency to nuisance tripping and a high flexibility to be adapted to different, especially predefined selective, tripping requirements.

As a result, the DC overcurrent detector has a low tendency to nuisance tripping and a high flexibility to be adapted to different, especially predefined selective, tripping requirements. It is also very robust in case of reverse currents.

The invention is described with reference to the drawings. The drawings showing only preferred embodiments of the invention.

The single FIG. shows a preferred embodiment of a DC-overcurrent detector 1 with at least one electric line 2 passing the detector 1 from a source terminal 7 of the detector 1 to a load terminal 12 of the detector 1, the detector 1 comprises:

- at least one first sensor 3 configured to monitoring an electric current in the electric line 2 and outputting a current measurement signal,
- at least one current flow direction sensor 4 configured to distinguish a current flow direction of the electric current in the electric line 2 between a first direction 14 from the source terminal 7 to the load terminal 12 and a second direction 15 from the load terminal 12 to the source terminal 7, and outputting a current flow direction signal,
- a comparator unit 5 adapted to compare an actual value of the current measurement signal with a threshold criterion, and outputting a trigger signal at a trigger output 13 in case the value of the current measurement signal reaches the threshold criterion.

The detector 1 further comprises a threshold criterion unit 6, with an input of the threshold criterion unit 6 being connected to the current flow direction sensor 4 for receiving an actual current flow direction, and with an output of the threshold criterion unit 6 being connected to the comparator unit 5, proving the comparator unit 5 with the threshold criterion, and that the threshold criterion unit 6 is adapted to determine a first threshold criterion in case the actual current flows in the first direction 14, and a second threshold criterion in case the actual current flows in the second direction 15.

As a result, the DC overcurrent detector 1 has a low tendency to nuisance tripping and a high flexibility to be adapted to different, especially predefined selective, tripping requirements. It is also very robust in case of reverse currents.

The terms overcurrent detector 1, detector 1 and DC overcurrent detector 1 are used as synonyms.

The actual overcurrent detector 1 has a different behavior for different directions of current flowing through them.

In the example described, the overcurrent detector 1 contains at least one electric line 2. Alternatively, the overcurrent detector 1 contains also a second electric line and can contain a number of further electric lines. The electric line 2 is connected to a source terminal 7 to be connected to an electric source for providing electric power, and to a load terminal 12 to be connected to an electric load for electric power consumption.

The overcurrent detector 1 can be a stand-alone component. However the DC overcurrent detector 1 is especially part of a DC-overcurrent protection switch 11.

The overcurrent detector 1 may also be embodied to detect a short current as special kind of an overcurrent.

The overcurrent detector 1 is implemented for DC applications.

In the example described and according the only FIGURE, the overcurrent detector 1 is an integral part of an overcurrent protective switching device or a circuit breaker 11. A trigger output 13 of the overcurrent detector 1 is connected to an actuator 9 and/or a switching or latching mechanism 8 of the circuit breaker 11, and the switching mechanism 8 is connected to at least one pair of switching contacts 10 arranged in the electric line 2 and the further preferred additional electric lines. The circuit breaker 11 further comprises clamps.

Alternatively the circuit breaker 11 can be implemented as a hybrid circuit breaker or a solid state circuit breaker. In case of an electronically controlled circuit breaker comprising a control unit, the trigger output 13 is connected to the control unit.

As indicated earlier, the overcurrent detector 1 comprises the first sensor 3 or current sensor 3 which monitors the electric current in the electric line 2. Preferably, the overcurrent detector 1 comprises one first sensor 3 for each electric line 2.

The first sensor 3 can be of any type of current sensor 3. The current sensor 3 outputs a current measurement signal. Typically the first sensor 3 outputs an analog current measurement signal. In this case the output of the first sensor 3 is preferably connected to an Analog to Digital Converter or ADC to convert the current measurement signal into an integer value. According the preferred embodiment the actual overcurrent detector 1 is implemented mostly digital. However it would also be possible to implement it analog.

The current in an electric DC line 2 may have either one of the following directions of flow:

from the source terminal 7 to the load terminal 12. This is the usual or normal direction of current flow and named as first direction 14.

from the load terminal 12 to the source terminal 7. This is the so called reverse direction. In the actual context it is named second direction 15.

The detector 1 comprises at least one current flow direction sensor 4 to distinguish the direction of current flow, and outputting a current flow direction signal indicative of the direction of current flow.

According the preferred embodiment the current flow direction sensor 4 is embodied comprising at least one shunt and/or one hall effect sensor. Both sensor typed allow to distinguish the direction of current flow, as the polarity of the measurement signal is indicative of the current flow direction. The current flow direction sensor 4 may also be embodied comprising other types of sensors.

The detector 1 comprises a comparator unit 5 or trip unit, which is adapted to compare an actual value of the current measurement signal with a threshold criterion. In case the value of the current measurement signal reaches the threshold criterion the comparator unit 5 outputs a trigger signal at a trigger output 13.

If the overcurrent detector 1 is part of a circuit breaker 11 the comparator unit 5 is connected to an actuator 9. The trigger signal would cause the actuator 9 to operate the latching mechanism 8 to open the contacts 10. In case of a hybrid or solid state circuit breaker equivalent actions to switch off the electric line 2 will be caused by the trigger signal.

The threshold criterion used by the comparator unit 5 is not fixed or constant for all situations. The threshold criterion is different regarding the detected direction of current flow. The detector 1 comprises a threshold criterion unit 6 which is adapted to determine a first threshold criterion in case the actual current flows in the first direction 14 and a second threshold criterion in case the actual current flows in the second direction 15.

An input of the threshold criterion unit 6 is connected to the current flow direction sensor 4 for receiving an actual current flow direction. An output of the threshold criterion unit 6 is connected to the comparator unit 5, proving the comparator unit 5 with the threshold criterion.

The threshold criterion unit 6 may be embodied in different ways and according different functionalities. Preferably the threshold criterion unit 6 comprises a microcontroller or microprocessor or is embodied as part of a microcontroller or microprocessor. The threshold criterion unit 6 further comprises or is connected to a memory unit.

A threshold criterion contains a trigger time delay and a threshold current. The different threshold criterion contains may contain different trigger time delays and/or different threshold currents.

A threshold current is a value of an electric current which has to be reached or excited by the value of the electric current in the electric line 2. Reaching the threshold current may start a counter or timer.

A trigger time delay is a timespan to wait for if the value of the electric current still reaches or excites the threshold current value.

The threshold criterion is reached if the threshold current still reaches or excites the threshold criterion at the end of the trigger time delay. In this situation the comparator unit 5 outputs the trigger signal.

According a preferred embodiment the threshold current is different regarding the direction of current flow. Preferably the first threshold criterion comprises a first threshold current, and the second threshold criterion comprises a second threshold current. According this embodiment the second threshold current is higher than the first threshold current. Especially the value of the second threshold current is at least twice the value of the first threshold current. The threshold current is higher for currents in der reverse direction than for currents flowing in the normal direction.

According the especially preferred embodiment the first threshold criterion comprises a first trigger time delay, and the second threshold criterion comprises a second trigger time delay. The first trigger time delay is different to the second trigger time delay. Different trigger time delays are effective for causing different behavior for currents flowing in different directions.

In this association it is preferred that the second trigger time delay is longer than the first trigger time delay. This is an effective way for preventing nuisance tripping in case of reverse flowing currents.

Preferably the first trigger time delay is selected in the range from 0 s to 10 µs.

Preferably the second trigger time delay is selected in the range from 50 µs to 100 ms, especially 100 µs or 200 µs or 500 µs or 1 ms or 2 ms or 20 ms or 50 ms.

The different durations of the first and second trigger time delays can be implemented into the threshold criterion unit 6 as two different values which are unchangeable.

In this case a setup operation is suggested during which the detector 1 is trained in the real environment until the tripping criterions meet the local requirements. The detector 1 may comprise a so called setting up mode.

According a preferred embodiment the threshold criterion unit 6 is able to define, select or determine the duration of the first and/or the second trigger time delay. As the duration of the first trigger time delay is almost zero especially the duration of the second trigger time delay will be determined.

It is suggested that the first sensor 3 is further connected to the threshold criterion unit 6, and that the threshold criterion unit 6 is adapted to determine the duration of the second trigger time delay on base or as a function of the actual value of the current measurement signal. This helps to ensure that nuisance tripping can be avoided.

In association with this embodiment it is further suggested that the threshold criterion unit 6 is adapted to determine a first value of the second trigger time delay for a first value of the current measurement signal, and a second value of the second trigger time delay for a second value of the current measurement signal, with the first value of the second trigger time delay being greater than the second value of the second trigger time delay if the first value of the current measurement signal is greater than the second value of the current measurement signal. This means that high currents in reverse direction have a longer second trigger time delay. The higher the current in reverse direction the higher is the risk of tripping. Long trigger delay times reduce this risk effectively.

According a further preferred embodiment the DC-overcurrent protection switch 11 is embodied as hybrid or solid state circuit breaker including a limitation of currents. This feature would be implemented to limit inrush currents. However it could also be used to limit currents to avoid nuisance tripping in this context.

The following are principles for understanding and interpreting the actual disclosure.

Features are usually introduced with an indefinite article "one, a, an". Unless otherwise stated in the context, therefore, "one, a, an" is not to be understood as a number word.

The binding word "or" is to be interpreted as inclusive and not as exclusive. Unless the context dictates otherwise, "A or B" also includes "A and B", where "A" and "B" represent any features.

By means of an ordering number word, for example "first", "second" or "third", in particular a feature X or an object Y are distinguished in several embodiments, unless otherwise defined by the disclosure of the invention. In particular, a feature X or object Y with an ordering number word in a claim does not mean that an embodiment of the invention covered by this claim must have a further feature X or another object Y.

For ranges of values, the endpoints are included, unless the context dictates otherwise.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described above and below. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

What is claimed is:

1. A DC-overcurrent detector, comprising:
    at least one electric line passing the detector from a source terminal of the detector to a load terminal of the detector;
    at least one first sensor configured to monitor an electric current in the at least one electric line and output a current measurement signal;
    at least one current flow direction sensor configured to distinguish a current flow direction of the electric current in the at least one electric line between a first direction from the source terminal to the load terminal and a second direction from the load terminal to the source terminal, and output a current flow direction signal;
    a comparator unit configured to compare an actual value of the current measurement signal with a threshold criterion, and to output a trigger signal at a trigger output if a value of the current measurement signal reaches the threshold criterion; and
    a threshold criterion unit, an input of the threshold criterion unit being connected to the at least one current flow direction sensor, and an output of the threshold criterion unit being connected to the comparator unit, providing the comparator unit with the threshold criterion,
    wherein the threshold criterion unit is configured to determine a first threshold criterion if the actual current flows in the first direction, and a second threshold criterion if the actual current flows in the second direction,
    wherein the first threshold criterion comprises a first trigger time delay,
    wherein the second threshold criterion comprises a second trigger time delay,
    wherein the first trigger time delay is different than the second trigger time delay, and
    wherein the threshold criterion unit is configured to determine a first value of the second trigger time delay for a first value of the current measurement signal, and a second value of the second trigger time delay for a second value of the current measurement signal, with the first value of the second trigger time delay being greater than the second value of the second trigger time delay if the first value of the current measurement signal is greater than the second value of the current measurement signal.

2. The DC-overcurrent detector of claim 1, wherein the second trigger time delay is longer than the first trigger time delay.

3. The DC-overcurrent detector of claim 1, wherein the first trigger time delay is in a range from 0 s to 10 µs.

4. The DC-overcurrent detector of claim 1, wherein the second trigger time delay is in a range from 50 µsis to 100 ms.

5. The DC-overcurrent detector of claim 1, wherein the at least one first sensor is connected to the threshold criterion unit, and wherein the threshold criterion unit is configured to determine a duration of the second trigger time delay based on the actual value of the current measurement signal.

6. The DC-overcurrent detector of claim 1, wherein the first threshold criterion comprises a first threshold current,
wherein the second threshold criterion comprises a second threshold current, and
wherein the second threshold current is higher than the first threshold current.

7. The DC-overcurrent detector of claim 1, wherein the at least one current flow direction sensor comprises at least one shunt and/or one hall effect sensor.

8. A DC-overcurrent protection switch, comprising:
the DC overcurrent detector of claim 1,
wherein the trigger output of the detector is connected at least indirectly to a latching mechanism and/or a control unit of the switch.

9. The DC-overcurrent detector of claim 4, wherein the second trigger time delay is in a range from 50 µs is to 100 µs.

10. The DC-overcurrent detector of claim 4, wherein the second trigger time delay is in a range from 50 µs to 200 µs.

11. The DC-overcurrent detector of claim 4, wherein the second trigger time delay is in a range from 50 µs to 500 µs.

12. The DC-overcurrent detector of claim 4, wherein the second trigger time delay is in a range from 50 µs to 1 ms.

13. The DC-overcurrent detector of claim 4, wherein the second trigger time delay is in a range from 50 µs to 2 ms.

14. The DC-overcurrent detector of claim 4, wherein the second trigger time delay is in a range from 50 µs to 20 ms.

15. The DC-overcurrent detector of claim 4, wherein the second trigger time delay is in a range from 50 µs to 50 ms.

16. The DC-overcurrent detector of claim 1, wherein the threshold criterion unit comprises microcontroller or microprocessor or is embodied as part of a microcontroller or microprocessor.

17. The DC-overcurrent detector of claim 1, wherein the electric current is a DC current, and wherein the first direction is opposite of the second direction.

* * * * *